US012656407B2

(12) United States Patent
Choi et al.

(10) Patent No.: US 12,656,407 B2
(45) Date of Patent: Jun. 16, 2026

(54) APPARATUS AND METHOD FOR DIAGNOSING STATE OF BATTERY

(71) Applicant: LG Energy Solution, Ltd., Seoul (KR)

(72) Inventors: Hyun-Jun Choi, Daejeon (KR);
Dae-Soo Kim, Daejeon (KR);
Young-Deok Kim, Daejeon (KR);
Bo-Mi Lim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 715 days.

(21) Appl. No.: 17/924,282

(22) PCT Filed: Apr. 27, 2021

(86) PCT No.: PCT/KR2021/005339
§ 371 (c)(1),
(2) Date: Nov. 9, 2022

(87) PCT Pub. No.: WO2021/230537
PCT Pub. Date: Nov. 18, 2021

(65) Prior Publication Data
US 2023/0194620 A1 Jun. 22, 2023

(30) Foreign Application Priority Data
May 15, 2020 (KR) ........................ 10-2020-0058254

(51) Int. Cl.
*G01R 31/392* (2019.01)
*G01R 31/367* (2019.01)
*G01R 31/388* (2019.01)

(52) U.S. Cl.
CPC ......... *G01R 31/392* (2019.01); *G01R 31/367* (2019.01); *G01R 31/388* (2019.01)

(58) Field of Classification Search
None
See application file for complete search history.

(56) References Cited

U.S. PATENT DOCUMENTS 10,393,813 B2 * 8/2019 Sun .......................... H02J 7/005
2005/0017684 A1 * 1/2005 Brecht .............. H02J 7/007184
320/131

(Continued)

FOREIGN PATENT DOCUMENTS

CN 101542821 A 9/2009
CN 102844931 A 12/2012

(Continued)

OTHER PUBLICATIONS

Extended European Search Report for Application No. 21803095.5 dated Aug. 22, 2023. 8 pgs.

(Continued)

*Primary Examiner* — Lina Cordero
(74) *Attorney, Agent, or Firm* — Lerner David LLP

(57) ABSTRACT

An apparatus for diagnosing a state of a battery includes a profile obtaining unit configured to obtain a voltage profile of a battery for voltage and capacity of the battery, and a control unit configured to obtain a differential profile for the voltage and the capacity from the voltage profile, select a plurality of peaks included in a predetermined voltage section of the obtained differential profile, determine a first peak associated with a negative electrode and a second peak associated with a positive electrode among the plurality of selected peaks, compare the first peak and the second peak with a first reference peak and a second reference peak of a preset reference profile, respectively, and diagnose a state of the battery based on at least one of a difference between the first peak and the first reference peak or a difference between the second peak and the second reference peak.

15 Claims, 5 Drawing Sheets

(56) References Cited

U.S. PATENT DOCUMENTS

| | | |
|---|---|---|
| 2010/0156351 A1 | 6/2010 | Ugaji et al. |
| 2012/0105069 A1 | 5/2012 | Wang et al. |
| 2013/0099794 A1 | 4/2013 | Takahashi et al. |
| 2013/0119940 A1 | 5/2013 | Iriyama et al. |
| 2013/0314050 A1 | 11/2013 | Matsubara et al. |
| 2013/0323542 A1 | 12/2013 | Wijayawardhana et al. |
| 2016/0061908 A1 | 3/2016 | Torai et al. |
| 2020/0271727 A1 | 8/2020 | Bae et al. |
| 2020/0366115 A1 | 11/2020 | Kim et al. |
| 2021/0359347 A1 | 11/2021 | Stefanopoulou et al. |
| 2023/0014689 A1 | 1/2023 | Ogasawara et al. |

FOREIGN PATENT DOCUMENTS

| | | |
|---|---|---|
| CN | 103053066 A | 4/2013 |
| CN | 103457003 A | 12/2013 |
| JP | 2013019709 A | 1/2013 |
| JP | 2013247003 A | 12/2013 |
| JP | 5682955 B2 | 3/2015 |
| JP | 2016-053564 A | 4/2016 |
| JP | 2017059386 A | 3/2017 |
| JP | 2017133870 A | 8/2017 |
| JP | 2018147748 A | 9/2018 |
| JP | 201945351 A | 3/2019 |
| JP | 6638227 B2 | 1/2020 |
| JP | 6918433 B1 | 8/2021 |
| KR | 20190118535 A | 10/2019 |
| KR | 20200026128 A | 3/2020 |
| WO | 2020/033343 A1 | 2/2020 |

OTHER PUBLICATIONS

International Search Report for Application No. PCT/KR2021/005339 mailed Aug. 19, 2021, pp. 1-3.

* cited by examiner

APPARATUS AND METHOD FOR DIAGNOSING STATE OF BATTERY

CROSS-REFERENCE TO RELATED APPLICATIONS

The present application is a national phase entry under 35 U.S.C. § 371 of International Application No. PCT/KR2021/005339 filed Apr. 27, 2021, which claims priority from Korean Patent Application No. 10-2020-0058254 filed May 15, 2020, all of which are incorporated herein by reference.

TECHNICAL FIELD

The present disclosure relates to an apparatus and method for diagnosing a state of a battery, and more particularly, to an apparatus and method for diagnosing a state of a battery, which diagnoses degradation of a battery by using real-time cycle data.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-discharging rate and high energy density.

A battery cell may be degraded through repeated charging or discharging. For example, at a positive electrode of the battery cell, the electrolyte may be oxidized or the crystal structure may be destroyed, thereby degrading the battery cell. At a negative electrode, metallic lithium may be precipitated to degrade the battery cell. Also, in general, depending on the manufacturing conditions of the lithium-ion secondary battery, the capacity deterioration of the secondary battery may be accelerated. Therefore, conventionally, a technique for diagnosing degradation of a battery cell based on a differential profile for voltage and capacity of the battery cell has been disclosed.

FIG. 1 is a diagram schematically showing a voltage profile 10 according to the prior art.

Referring to FIG. 1, the voltage profile 10 is a profile showing a capacity Q and a voltage for a battery cell. In the voltage profile 10, a battery profile 13 may be expressed as a difference between a positive electrode profile 11 and a negative electrode profile 12.

FIG. 2 is a diagram schematically showing a differential profile 20 according to the prior art.

Referring to FIG. 2, the differential profile 20 is a profile in which the capacity of a battery cell is differentiated by voltage. In the differential profile 20 shown in FIG. 2, battery degradation was diagnosed using at least one of a first peak 21, a second peak 22, a fourth peak 24, a fifth peak 25 and a sixth peak 26. For example, conventionally, degradation of a negative electrode of a battery is diagnosed using the first peak 21 and/or the second peak 22, and degradation of a positive electrode of the battery is diagnosed using at least one of the fourth peak 24, the fifth peak 25 and the sixth peak 26.

Meanwhile, a third peak 23 of the differential profile 20 is a peak in which the positive electrode peak and the negative electrode peak of the battery cell are mixed. That is, in the prior art, there is a problem that the positive electrode degradation or the negative electrode degradation of the battery may not be specifically diagnosed based on the third peak 23 in which the positive electrode peak and the negative electrode peak are mixed. Therefore, in the prior art, positive electrode degradation and negative electrode degradation of the battery are diagnosed using peaks except for the third peak 23 among the plurality of peaks included in the differential profile 20.

In addition, in the prior art, as shown in FIG. 2, in order to obtain the differential profile 20 in which a plurality of peaks may be distinguished, there is a problem in that the battery cell needs to be charged and/or discharged at a low rate. For example, the voltage profile 10 of FIG. 1 may be obtained while charging the battery cell at 0.05 C (C-rate), and the differential profile 20 of FIG. 2 may be obtained based on the voltage profile 10 of FIG. 1.

That is, since there is a limit that each peak included in the differential profile 20 may be clearly expressed only when the battery cell is charged or discharged at a low rate, there is a problem that the prior art may be applied only in very limited situations, such as a battery cell test process.

SUMMARY

Technical Problem

The present disclosure is designed to solve the problems of the related art, and therefore the present disclosure is directed to providing an apparatus and method for diagnosing a state of a battery, which may diagnose degradation of a battery by interpreting a specific peak included in a differential profile obtained through high-rate charging or high-rate discharging.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a state of a battery, comprising: a controller; and memory having programmed thereon instructions that, when executed by the controller, cause the controller to: receive a voltage profile of a battery for a voltage and a capacity of the battery; obtain a differential profile for the voltage and the capacity from the received voltage profile, select a plurality of peaks included in a predetermined voltage section from the obtained differential profile, determine a first peak associated with a negative electrode and a second peak associated with a positive electrode from among the plurality of selected peaks, compare the first peak and the second peak with a first reference peak and a second reference peak of a preset reference profile, respectively, and diagnose a state of the battery based on at least one of a difference between the first peak and the first reference peak or a difference between the second peak and the second reference peak.

The instructions may be configured to cause the controller to set a largest peak in the reference profile as the first reference peak and set a second largest peak as the second reference peak.

The peak may be a point at which a slope is 0 in both the reference profile and the differential profile and at which an instantaneous change rate according to voltage switches from positive to negative.

The instructions may be configured to cause the controller to set one of the plurality of selected peaks corresponding to the first reference peak in the differential profile as the first peak and to set another one of the plurality of selected peaks corresponding to the second reference peak in the differential profile as the second peak.

The reference profile may be a profile for voltage and differential capacity of a reference cell corresponding to the battery, wherein the voltage and differential capacity are measured while the reference cell is being charged within a predetermined C-rate range.

The differential profile may be a profile for voltage and differential capacity of the battery, wherein the voltage and differential capacity are measured while the battery is being charged within the same C-rate range as the reference cell.

The instructions may be configured to cause the controller to calculate a second peak change value by comparing the second peak with the second reference peak and diagnose whether the battery is degraded based on the second peak change value.

The instructions may be configured to cause the controller to in response to a diagnosis that the battery is degraded, calculate a first peak change value by comparing the first peak with the first reference peak and diagnose a cause of degradation of the battery based on the first peak change value and the second peak change value.

The instructions may be configured to cause the controller to in response to the first peak change value and the second peak change value being equal to or greater than a predetermined magnitude diagnose that the cause of degradation of the battery is negative electrode degradation and positive electrode degradation.

The instructions may be configured to cause the controller to in response to the first peak change value being smaller than a predetermined magnitude and the second peak change value being equal to or greater than the predetermined magnitude diagnose that the cause of degradation of the battery is positive electrode degradation.

The instructions may be configured to cause the controller to in response to a diagnosis that the battery is degraded adjust at least one of an upper limit of a state of charge (SOC) of the battery, a lower limit of the SOC of the battery, or an upper limit of a charging/discharging C-rate of the battery.

In another aspect of the present disclosure, the memory may further store the voltage profile obtained by the profile obtaining unit at every charging cycle in which the battery is charged.

The instructions may be configured to cause the controller to at each of a plurality of charging cycles in which the battery is charged, receive a respective voltage profile, wherein the memory is configured to store the respective voltage profiles, for each respective voltage profile obtain a respective differential profile from the voltage profile, for each respective differential profile, determine a first peak and a second peak in the differential profile, and diagnose whether the battery is degraded based on at least one of a difference between the first peak and the first reference peak or a difference between the second peak and the second reference peak for at least one of the respective differential profiles.

In still another aspect of the present disclosure, there is also provided a battery pack, comprising the apparatus for diagnosing a state of a battery according to any of the embodiments of the present disclosure.

In still another aspect of the present disclosure, there is also provided a vehicle, comprising the apparatus for diagnosing a state of a battery according to any of the embodiments of the present disclosure.

In still another aspect of the present disclosure, there is also provided a method for diagnosing a state of a battery, comprising: receiving, by a controller, a voltage profile of a battery for voltage and capacity of the battery; obtaining, by the controller, a differential profile for the voltage and the capacity from the voltage profile obtained in the voltage profile obtaining step; selecting, by the controller, a plurality of peaks included in a predetermined voltage section from the differential profile obtained in the differential profile obtaining step; determining, by the controller, a first peak associated with a negative electrode and a second peak associated with a positive electrode among the plurality of selected peaks; comparing, by the controller, the first peak and the second peak with a first reference peak and a second reference peak of a preset reference profile, respectively; and diagnosing, by the controller, a state of the battery based on at least one of a difference between the first peak and the first reference peak or a difference between the second peak and the second reference peak.

Advantageous Effects

According to one aspect of the present disclosure, the degradation of the battery may be diagnosed in consideration of the behavior of the first peak and the second peak included in the differential profile of the battery.

In addition, by specifically diagnosing whether the positive electrode of the battery is degraded or the negative electrode is degraded, the cause of degradation of the battery may be diagnosed more accurately.

In addition, according to one aspect of the present disclosure, even if the battery is charged at a high rate of 0.1 C or more, by interpreting the differential profile, it is possible to diagnose whether the battery is degraded and/or what is the cause of the degradation.

The effects of the present disclosure are not limited to the above, and other effects not mentioned herein will be clearly understood by those skilled in the art from the appended claims.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

5

6

Figure 4:
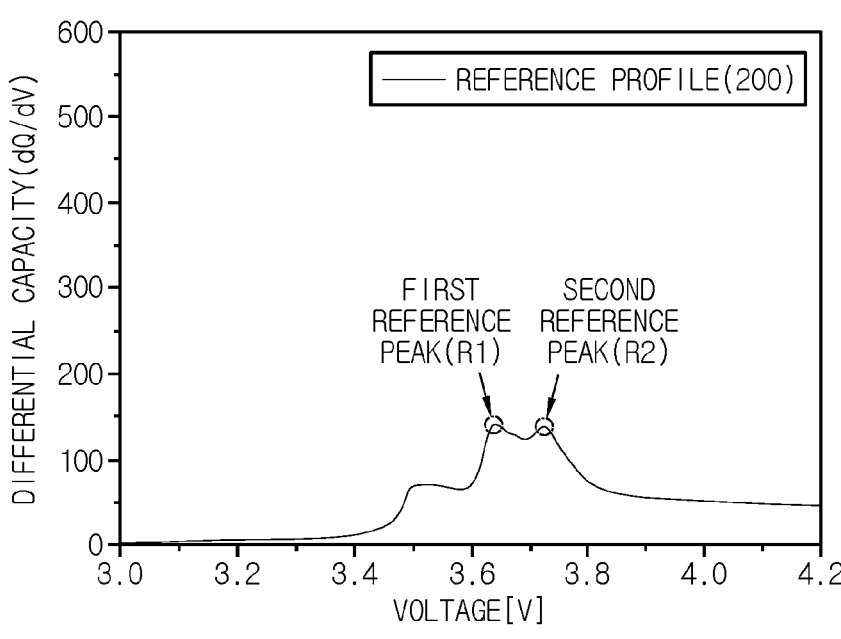

FIG. 4 is a diagram schematically showing a reference profile of the apparatus for diagnosing a state of a battery according to an embodiment of the present disclosure.

Figure 5:
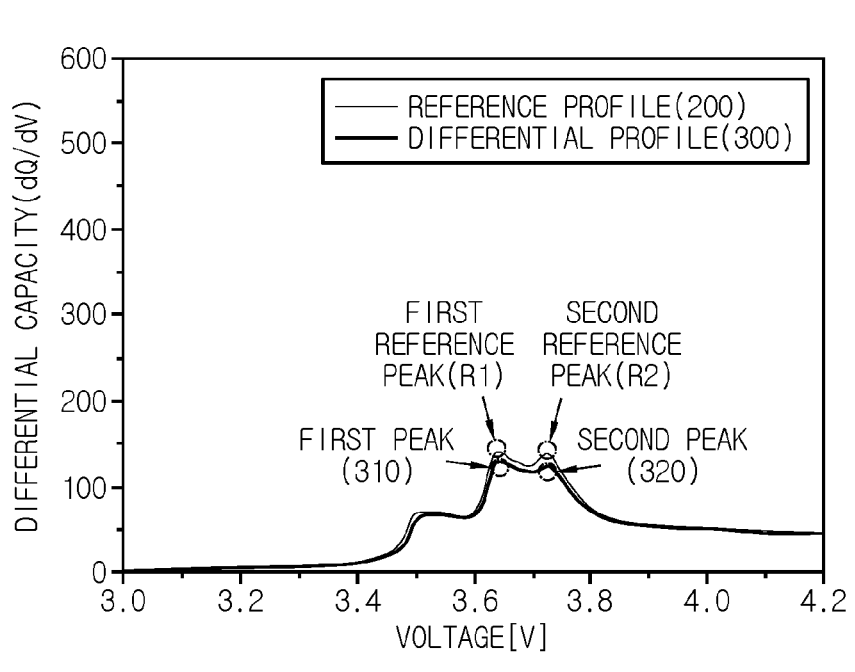

FIG. 5 is a diagram schematically showing an example of the reference profile and the differential profile of the apparatus for diagnosing a state of a battery according to an embodiment of the present disclosure.

Figure 6:
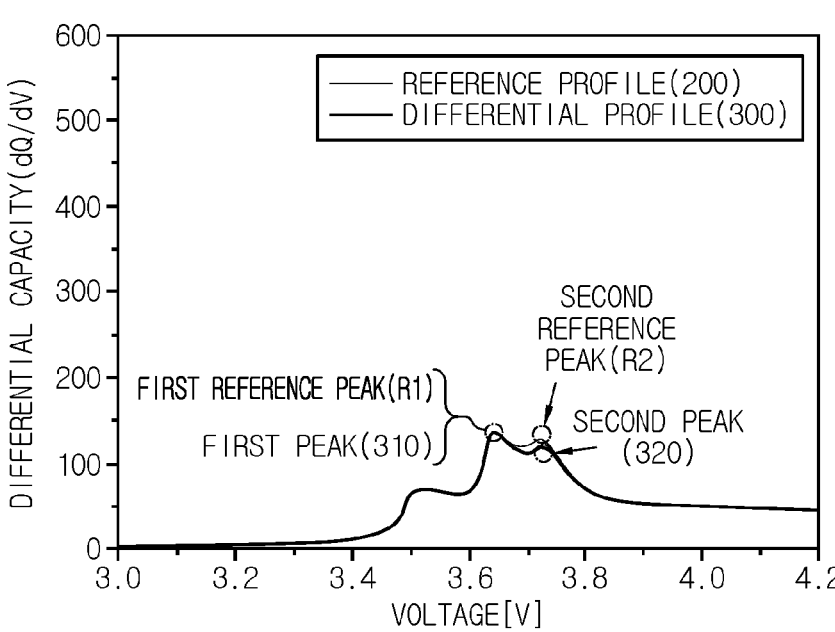

FIG. 6 is a diagram schematically showing another example of the reference profile and the differential profile of the apparatus for diagnosing a state of a battery according to an embodiment of the present disclosure.

Figure 7:
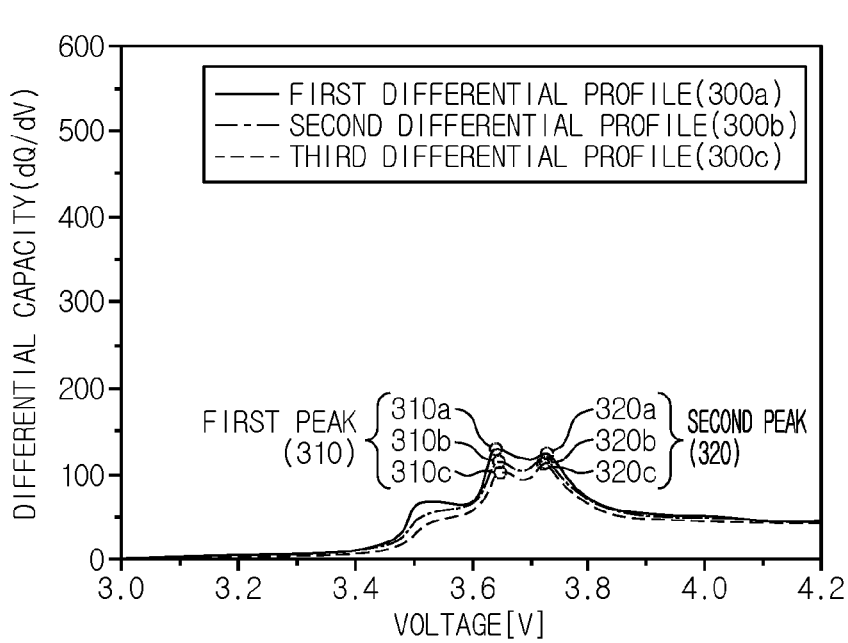

FIG. 7 is a diagram schematically showing an example of a plurality of differential profiles, obtained by the apparatus for diagnosing a state of a battery according to an embodiment of the present disclosure.

Figure 8:
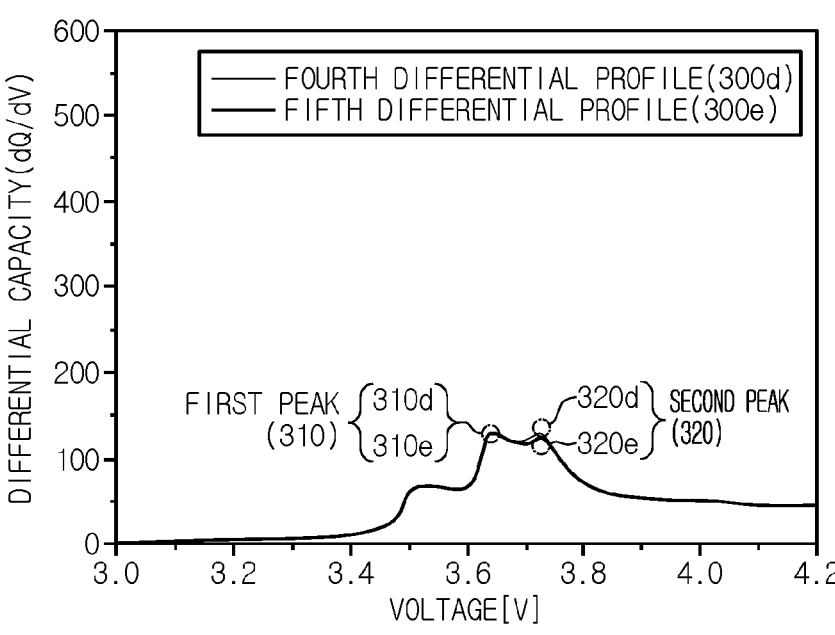

FIG. 8 is a diagram schematically showing another example of the plurality of differential profiles, obtained by the apparatus for diagnosing a state of a battery according to an embodiment of the present disclosure.

Figure 9:
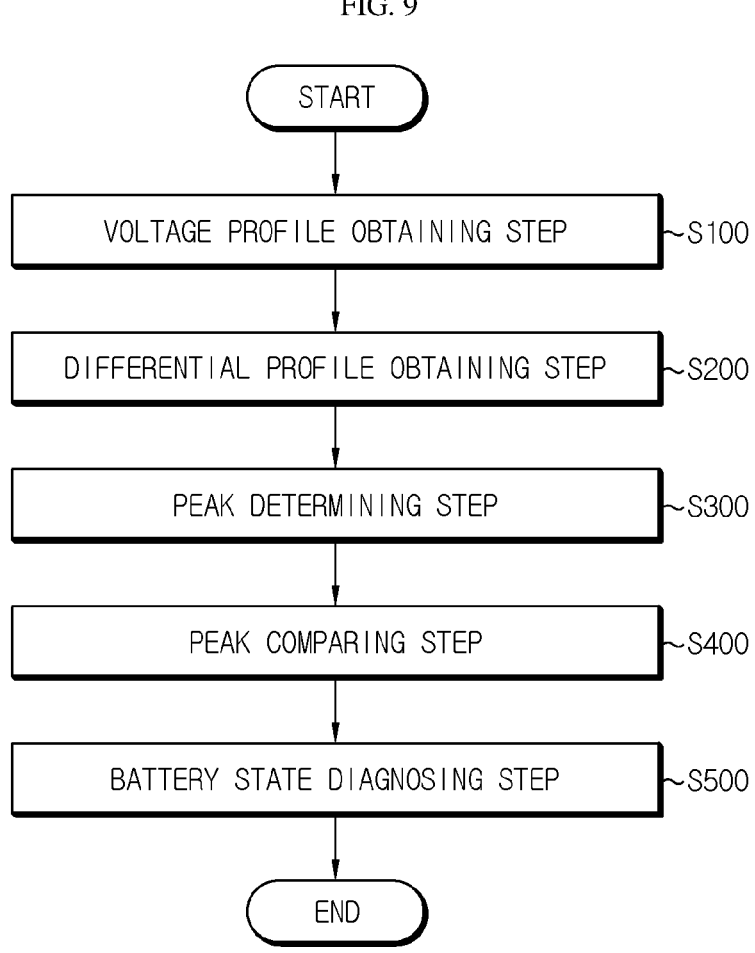

FIG. 9 is a diagram schematically showing a method for diagnosing a state of a battery according to another embodiment of the present disclosure.

DETAILED DESCRIPTION

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, a preferred embodiment of the present disclosure will be described in detail with reference to the accompanying drawings.

Figure 3:
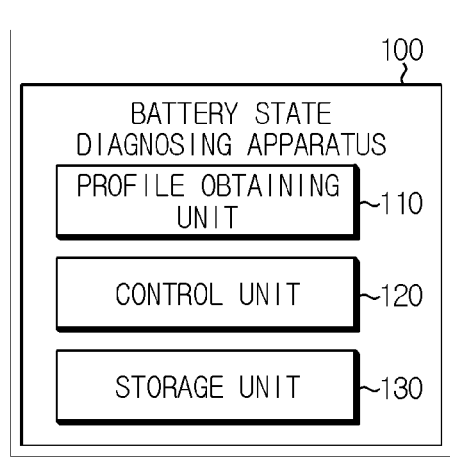
FIG. 3 is a diagram schematically showing an apparatus for diagnosing a state of a battery according to an embodiment of the present disclosure.

FIG. 3 is a diagram schematically showing an apparatus 100 for diagnosing a state of a battery according to an embodiment of the present disclosure.

Referring to FIG. 3, the apparatus 100 for diagnosing a state of a battery according to an embodiment of the present disclosure may include a profile obtaining unit 110 and a control unit 120.

The profile obtaining unit 110 may be configured to obtain a voltage profile of a battery for voltage and capacity of the battery.

Here, the battery includes a negative electrode terminal and a positive electrode terminal, and may refer to one independent battery cell that is physically separable. For example, one pouch-type lithium polymer cell may be regarded as a battery. Also, the battery may refer to a battery module in which one or more battery cells are connected in series and/or in parallel.

Specifically, the profile obtaining unit 110 may obtain a voltage profile for voltage and capacity of the battery measured while the battery is being charged and/or discharged.

Figure 1:
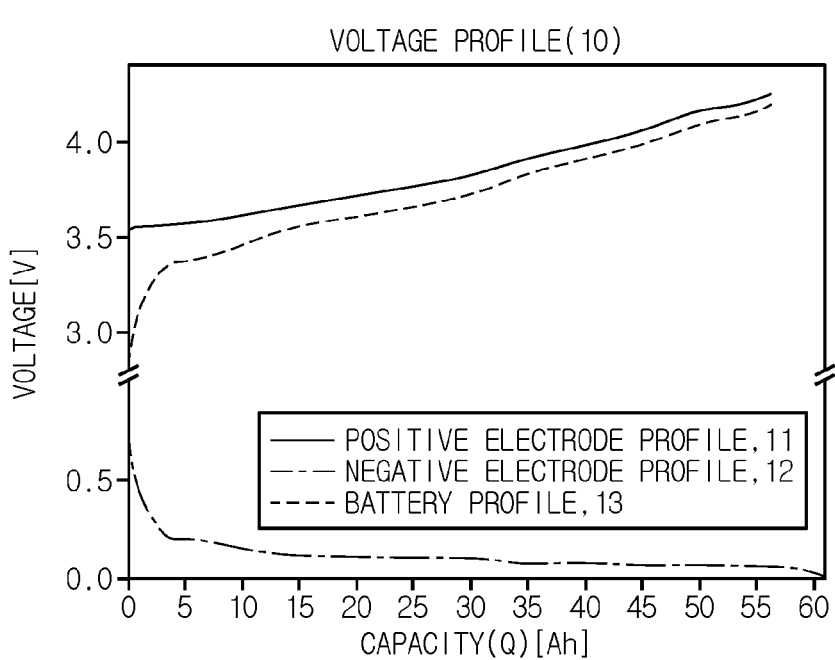
FIG. 1 is a diagram schematically showing a voltage profile according to the prior art.

For example, the profile obtaining unit 110 may obtain a voltage profile of a battery such as a voltage profile 10 of FIG. 1. That is, the voltage profile obtained by the profile obtaining unit 110 may represent the voltage of the battery with respect to the capacity of the battery.

The control unit 120 may be configured to obtain a differential profile 300 for the voltage and the capacity from the voltage profile obtained by the profile obtaining unit 110.

Specifically, the control unit 120 may be communicatively connected to the profile obtaining unit 110. For example, the profile obtaining unit 110 may transmit the obtained voltage profile to the control unit 120, and the control unit 120 may receive the voltage profile. As another example, the control unit 120 may obtain the voltage profile by accessing the profile obtaining unit 110.

After obtaining the voltage profile, the control unit 120 may obtain the differential profile 300 based on the voltage profile.

Specifically, the control unit 120 may calculate a differential capacity (dQ/dV) of the battery by differentiating the capacity Q of the battery with the voltage V of the battery, and obtain the differential profile 300 indicating the differential capacity of the battery with respect to the voltage of the battery.

Also, the control unit 120 may be configured to select a plurality of peaks included in a predetermined voltage section from the obtained differential profile 300.

Here, the predetermined voltage section is a preset voltage section, and may be a voltage section to which a first reference peak R1 and a second reference peak R2 of the reference profile 200 belong. That is, the control unit 120 may select a plurality of peaks included in the voltage section to which the first reference peak R1 and the second reference peak R2 of the reference profile 200 belong, from the obtained differential profile 300.

Here, the reference profile 200 is a differential profile 300 for a reference cell, and may be a profile indicating a differential capacity of the reference cell with respect to the voltage of the reference cell. In addition, the reference cell may be a cell corresponding to the battery.

For example, the reference cell may be a battery itself in a BOL (Beginning of Life) state, or a separate battery having the same specifications as the battery. In addition, the reference profile 200 may be an initial differential profile 300 obtained from the reference cell. As another example, the reference profile 200 may be a differential profile 300 of the battery obtained in advance at a previous time point. That is, the reference profile 200 is a reference profile for comparison with the differential profile 300 of the battery. As long as a profile is obtained in advance before the control unit 120 obtains the differential profile 300 in order to diagnose the state of the battery, the profile may be considered as the reference profile 200 with respect to the differential profile 300.

Preferably, the reference cell may be a BOL state of the target battery, and the reference profile 200 may be the initial differential profile 300 for the reference cell. If the reference profile 200 is used to diagnose the state of the battery, the control unit 120 may more accurately diagnose the difference between the BOL state and a current state of the battery. Therefore, hereinafter, for convenience of explanation and improvement of accuracy of battery state diagnosis, the reference cell will be described as referring to a target battery in a BOL state, and the reference profile 200 will be described as referring to an initial differential profile 300 for the reference cell.

In addition, the control unit 120 may be configured to determine a first peak 310 associated with the negative electrode and a second peak 320 associated with the positive electrode among the plurality of selected peaks.

Preferably, in the differential profile 300, the plurality of peaks included in the predetermined voltage section may include a first peak 310 associated with the negative electrode and a second peak 320 associated with the positive electrode.

For example, the predetermined voltage section may include two peaks. In this case, among the two peaks included in the predetermined voltage section, the control unit 120 may determine a peak at a low potential side as the first peak 310 and determine a peak at a high potential side as the second peak 320.

The control unit 120 may be configured to compare the first peak 310 and the second peak 320 with a first reference peak R1 and a second reference peak R2 of the preset reference profile 200, respectively.

FIG. 4 is a diagram schematically showing a reference profile 200 of the apparatus 100 for diagnosing a state of a battery according to an embodiment of the present disclosure. FIG. 5 is a diagram schematically showing an example of the reference profile 200 and the differential profile 300 of the apparatus 100 for diagnosing a state of a battery according to an embodiment of the present disclosure.

Referring to FIGS. 4 and 5, the first reference peak R1 and the second reference peak R2 may be included in a voltage section of 3.6 [V] to 3.8 [V]. Also, referring to FIG. 5, the first peak 310 and the second peak 320 may be included in a voltage section of 3.6 [V] to 3.8 [V].

Here, the peak is a point at which inclination is 0 in the reference profile 200 and the differential profile 300, and refers to a point at which an instantaneous change rate according to voltage changes from positive to negative.

For example, in the embodiment of FIG. 5, inclinations of the first reference peak R1, the second reference peak R2, the first peak 310 and the second peak 320 may be 0. That is, the first reference peak R1, the second reference peak R2, the first peak 310 and the second peak 320 may be upwardly convex points.

Preferably, the first peak 310 is a peak corresponding to the first reference peak R1, and the second peak 320 is a peak corresponding to the second reference peak R2. To this end, the control unit 120 may be configured to determine a peak corresponding to the first reference peak R1 in the differential profile 300 as the first peak 310 and determine a peak corresponding to the second reference peak R2 in the differential profile 300 as the second peak 320.

The control unit 120 may be configured to diagnose the state of the battery in consideration of at least one of a behavior change of the first peak 310 with respect to the first reference peak R1 and a behavior change of the second peak 320 with respect to the second reference peak R2.

Here, the behavior change may refer to a change from the differential capacity values of the reference peaks R1, R2 to the differential capacity values of the peaks 310, 320. For example, the behavior changes of the peaks 310, 320 may be determined by comparing the magnitudes of the differential capacity values of the reference peaks R1, R2 and the differential capacity values of the peaks 310, 320 and calculating the difference. In the embodiment of FIG. 5, since the differential capacity value of the first peak 310 is smaller than the differential capacity value of the first reference peak R1, the behavior change of the first peak 310 may be determined as having a reduced differential capacity value. In addition, since the differential capacity value of the second peak 320 is smaller than the differential capacity value of the second reference peak R2, the behavior change of the second peak 320 may be determined as having a reduced differential capacity value.

For example, the control unit 120 may diagnose whether the battery is degraded based on at least one of the behavior change of the first peak 310 and the behavior change of the second peak 320. In addition, the control unit 120 may specifically diagnose whether the positive electrode of the battery is degraded and/or the negative electrode of the battery is degraded.

The apparatus 100 for diagnosing a state of a battery according to an embodiment of the present disclosure may diagnose whether the battery is degraded in consideration of behaviors of the first peak 310 and the second peak 320 included in the differential profile 300 of the battery. In particular, the apparatus 100 for diagnosing a state of a battery can more accurately diagnose the cause of degradation of the battery by specifically diagnosing whether the positive electrode of the battery is degraded or the negative electrode of the battery is degraded.

Meanwhile, the control unit 120 included in the apparatus 100 for diagnosing a state of a battery according to an embodiment of the present disclosure may optionally include a processor, an application-specific integrated circuit (ASIC), another chipset, a logic circuit, a register, a communication modem, and a data processing device, and the like, known in the art to execute various control logics disclosed below. In addition, when the control logic is implemented in software, the control unit 120 may be implemented as a set of program modules. At this time, the program module may be stored in a memory and executed by the control unit 120. The memory may be provided in or out of the control unit 120, and may be connected to the control unit 120 by various well-known means.

The control unit 120 may be configured to set a largest peak in the reference profile 200 as the first reference peak R1 and set a second largest peak as the second reference peak R2. Specifically, the control unit 120 may be configured to set a peak having a largest differential capacity value in the reference profile 200 as the first reference peak R1 and set a peak having a second largest differential capacity value as the second reference peak R2.

For example, in the reference profile 200 of FIG. 4, the largest peak may be set as the first reference peak R1. In addition, in the reference profile 200 of FIG. 4, the second largest peak may be set as the second reference peak R2.

In addition, the control unit 120 may be configured to determine a peak corresponding to the first reference peak R1 in the differential profile 300 as the first peak 310 and determine a peak corresponding to the second reference peak R2 in the differential profile 300 as the second peak 320.

For example, the control unit 120 may determine a peak having a voltage value closest to the voltage value of the first reference peak R1 in the differential profile 300 as the first peak 310. Similarly, the control unit 120 may determine a peak having a voltage value closest to the voltage value of the second reference peak R2 in the differential profile 300 as the second peak 320.

That is, the apparatus 100 for diagnosing a state of a battery according to an embodiment of the present disclosure may more accurately diagnose the state of the battery based on the behavior change between the reference peaks R1, R2 of the reference profile 200 and the peaks 310, 320 of the differential profile 300 corresponding to each other.

In addition, the reference profile 200 may be a profile for voltage and differential capacity of the reference cell measured while the reference cell corresponding to the battery is being charged within a predetermined C-rate range. Also, the differential profile 300 may be a profile for the voltage and the differential capacity of the battery measured while the battery is being charged within the same C-rate range as the reference cell.

Here, the predetermined C-rate range may be a range of 0.1 C or more. That is, the reference profile 200 may be a profile obtained while the reference cell is being charged at a high rate in a C-rate range of 0.1 C or more. Preferably, the reference profile 200 may be a profile obtained while the reference cell is being charged at a C-rate of 0.2 C or more and 1 C or less. More preferably, the reference profile 200 may be a profile obtained while the reference cell is being charged at a C-rate of 0.33 C or more and 1 C or less. Hereinafter, for convenience of description, it will be described that the reference profile 200 and the differential profile 300 are obtained while the reference cell and the battery are being charged at a C-rate of 0.33 C, respectively.

Figure 2:
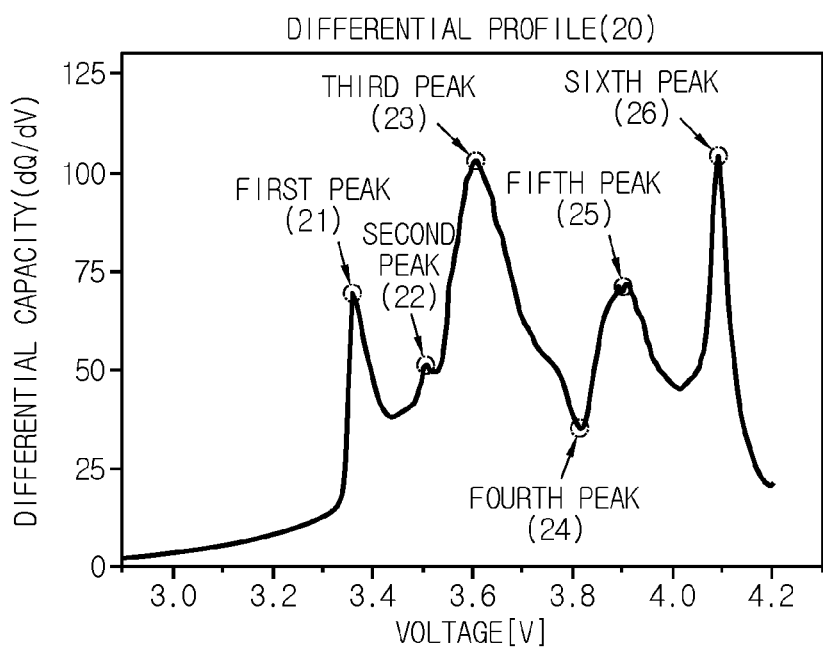
FIG. 2 is a diagram schematically showing a differential profile according to the prior art.

Meanwhile, the differential profile 20 of FIG. 2 may be a profile obtained while the battery cell is being charged at a C-rate of 0.05 C. Hereinafter, the differential profile 20 of FIG. 2 will be described as a profile obtained while the reference cell is being charged at a C-rate of 0.05 C.

That is, the differential profile 20 of FIG. 2 is a profile obtained while the reference cell is being charged at a low rate of a C-rate of about 0.05 C so that the first peak 21 to the sixth peak 26 may be clearly included. Accordingly, the first peak 21 to the sixth peak 26 may be included to be clearly distinguished in the differential profile 20 of FIG. 2.

On the contrary, the reference profile 200 of FIG. 4 is obtained while the reference cell is being charged at a high rate of a C-rate of 0.33 C. Therefore, in the reference profile 200, the first peak 21 to the sixth peak 26 included in the differential profile 20 of FIG. 2 are not clearly distinguished. Specifically, if the reference cell is high-rate charged at a C-rate of 0.33 C, the third peak 23 included in the differential profile 20 of FIG. 2 may be divided into the first reference peak R1 and the second reference peak R2 included in the reference profile 200 of FIG. 4. This is because, in the case of low-rate charging, the positive electrode peak and the negative electrode peak are mixed to form the third peak 23, but in the case of high-rate charging, the behaviors of the positive electrode and the negative electrode are changed to change a potential band where the positive electrode peak and the negative electrode peak are formed. Accordingly, the third peak 23 included in the differential profile 20 of FIG. 2 may be divided into the first reference peak R1 and the second reference peak R2 included in the reference profile 200 of FIG. 4 if the reference cell is high-rate charged (e.g., charged at a C-rate of 0.33 C).

In addition, in the differential profile 300 of the embodiment of FIG. 5, the control unit 120 may determine a peak corresponding to the first reference peak R1 as the first peak 310 and determine a peak corresponding to the second reference peak R2 as the second peak 320. After that, the control unit 120 may diagnose the state of the battery based on the behavior change of the first peak 310 and/or the behavior change of the second peak 320.

Therefore, different from the prior art where the state of the battery is diagnosed using a differential profile 20 obtained through low-rate charging, the apparatus 100 for diagnosing a state of a battery according to an embodiment of the present disclosure has an advantage of diagnosing the state of the battery using the differential profile 300 obtained through high-rate charging. In particular, since the state of the battery may be diagnosed even when the battery is high-rate charged, there is an advantage that the state of the battery may be diagnosed more quickly.

In addition, the apparatus 100 for diagnosing a state of a battery according to an embodiment of the present disclosure has an advantage of providing new peak interpretation capable of diagnosing the state of the battery through the behaviors of the plurality of peaks 310, 320 included in the differential profile 300 obtained through high-rate charging.

That is, the apparatus 100 for diagnosing a state of a battery may diagnose the state of the battery using the first reference peak R1 and the second reference peak R2, which have not been used for diagnosing the battery state in the prior art.

For example, in the prior art, since low-rate charging is required, there is a limitation in diagnosing the state of the battery only in limited situations in which low-rate charging is possible, such as a battery test stage. However, since the apparatus 100 for diagnosing a state of a battery according to the present disclosure may diagnose the state of the battery even at high-rate charging, there is an advantage of diagnosing the state of the battery even in various situations such as the situation where the battery is operated in an electronic device (an electronic product, a vehicle, an energy storage system (ESS), etc.).

The control unit 120 may be configured to calculate a second peak change value by comparing the second peak 320 with the second reference peak R2. In addition, the control unit 120 may be configured to diagnose whether the battery is degraded according to the second peak change value.

For example, the control unit 120 may calculate the second peak change value based on a difference between the differential capacity of the second peak 320 and the differential capacity of the second reference peak R2. Specifically, the control unit 120 may calculate a value obtained by subtracting the differential capacity value of the second peak 320 from the differential capacity value of the second reference peak R2 as the second peak change value.

In addition, if the calculated second peak change value is greater than or equal to a predetermined magnitude, the control unit 120 may diagnose that the battery is degraded. Conversely, if the calculated second peak change value is smaller than the predetermined magnitude, the control unit 120 may diagnose that the battery is not degraded. In this case, preferably, the predetermined magnitude may be a value fixed as an initial set value.

Specifically, since the predetermined magnitude is a reference value that is compared with the peak change value (the difference between the differential capacity value of the reference peak and the differential capacity value of the peak) in order to diagnose whether the battery is degraded, the predetermined magnitude may be a fixedly set value irrespective of the degree of degradation of the battery.

Therefore, the apparatus 100 for diagnosing a state of a battery according to an embodiment of the present disclosure has an advantage of rapidly diagnosing whether the battery is degraded in consideration of only the peak change value between the second reference peak R2 and the second peak 320.

If it is diagnosed that the battery is degraded, the control unit 120 may be configured to calculate a first peak change value by comparing the first peak 310 with the first reference peak R1. Specifically, the control unit 120 may calculate a value obtained by subtracting the differential capacity value of the first peak 310 from the differential capacity value of the first reference peak R1 as the first peak change value.

In addition, the control unit 120 may be configured to diagnose the cause of degradation of the battery according to the first peak change value and the second peak change value.

Specifically, the control unit 120 may diagnose the cause of degradation of the battery as positive electrode degradation and/or negative electrode degradation according to the first peak change value and the second peak change value. Here, the negative electrode degradation means that available lithium is lost and thus the negative electrode of the battery is degraded. In addition, the positive electrode degradation means that a positive electrode reaction area is lost and thus the positive electrode of the battery is degraded.

For example, after diagnosing whether the battery is degraded based on the second peak change value, the control unit 120 may calculate the first peak change value based on the difference between the differential capacity value of the first peak 310 and the differential capacity value of the first reference peak R1 in order to diagnose the cause of degradation of the battery. In addition, if the calculated first peak change value is greater than or equal to a predetermined magnitude, the control unit 120 may diagnose that the cause of degradation of the battery is negative electrode degradation and positive electrode degradation. Conversely, if the calculated first peak change value is smaller than the predetermined magnitude, the control unit 120 may diagnose that the cause of degradation of the battery is positive electrode degradation.

Specifically, if the calculated first peak change value is greater than or equal to the predetermined magnitude, the control unit 120 may diagnose the main cause of degradation of the battery by comparing the magnitudes of the first peak change value and the second peak change value. For example, if the first peak change value is greater than the second peak change value, the control unit 120 may diagnose that the main degradation cause of the battery is negative electrode degradation. Conversely, if the first peak change value is smaller than the second peak change value, the control unit 120 may diagnose that the main cause of degradation of the battery is positive electrode degradation.

FIG. 6 is a diagram schematically showing another example of the reference profile 200 and the differential profile 300 of the apparatus 100 for diagnosing a state of a battery according to an embodiment of the present disclosure.

Specifically, FIG. 5 is a diagram schematically showing the differential profile 300 of a battery in which the negative electrode and the positive electrode are degraded, and FIG. 6 is a diagram schematically showing the differential profile 300 of a battery in which the positive electrode is degraded.

Referring to FIGS. 5 and 6, if the positive electrode of the battery is degraded, the second peak change value between the second reference peak R2 and the second peak 320 may be greater than or equal to a predetermined magnitude. That is, if the positive electrode of the battery is degraded, the differential capacity value of the second peak 320 may be smaller than the differential capacity value of the second reference peak R2 by the predetermined magnitude or more.

In addition, referring to FIGS. 5 and 6 again, if the negative electrode of the battery is degraded, the first peak change value between the first reference peak R1 and the first peak 310 may be greater than or equal to a predetermined magnitude. That is, if the negative electrode of the battery is degraded, the differential capacity value of the first peak 310 may be smaller than the differential capacity value of the first reference peak R1 by the predetermined magnitude or more.

That is, the control unit 120 may be configured to diagnose that the negative electrode and the positive electrode of the battery are lost, if the first peak change value and the second peak change value are equal to or greater than the predetermined magnitude. Alternatively, if the first peak change value is smaller than the predetermined magnitude and the second peak change value is greater than or equal to the predetermined magnitude, the control unit 120 may be configured to diagnose that the positive electrode of the battery is lost.

Therefore, the apparatus 100 for diagnosing a state of a battery according to an embodiment of the present disclosure has an advantage of quickly diagnosing whether the battery is degraded based on the second peak change value and specifically determining the cause of degradation of the battery based on the first peak change value.

As another example, a plurality of reference ranges may be preset for the first peak change value and the second peak change value of the battery. For example, the plurality of reference ranges may include a first reference range, a second reference range, and a third reference range. However, it should be noted that the plurality of reference ranges may be divided in more detail, instead of being divided into only three ranges as described below.

The control unit 120 may compare the first peak change value and the second peak change value with the plurality of reference ranges and diagnose whether the battery is degraded according to the comparison result.

After calculating the second peak change value, the control unit 120 may determine a second target range to which the second peak change value belongs among the plurality of reference ranges. In addition, the control unit 120 may diagnose whether the battery is degraded based on the content set in the second target range. For example, if the second target range is the first reference range, the control unit 120 may diagnose that the battery is not degraded. Conversely, if the second target range is the second reference range or the third reference range, the control unit 120 may diagnose that the battery is degraded.

If it is diagnosed that the battery is degraded, the control unit 120 may calculate a first peak change value between the first reference peak R1 and the first peak 310. In addition, control unit 120 may determine a first target range to which the first peak change value belongs among the plurality of reference ranges. In addition, the control unit 120 may diagnose the cause of degradation of the battery based on the content set in the first target range.

For example, if the first target range is the first reference range, the control unit 120 may diagnose that the cause of degradation of the battery is positive electrode degradation. Conversely, if the first target range is the second reference range or the third reference range, the control unit 120 may diagnose that the cause of degradation of the battery is positive electrode degradation and negative electrode degradation. The determination result of the control unit 120 according to the combination of the first target range and the second target range will be described in detail based on Table 1 below.

More specifically, the control unit 120 may compare the first peak change value and the second peak change value with the plurality of reference ranges and diagnose the degree of degradation of the battery according to the comparison result.

As described above, the first reference range may be set to an allowable error range. That is, the first reference range may mean a normal range. The second reference range may mean a warning range indicating that the battery is degraded so that the state of the battery state is a warning state. The third reference range may mean a dangerous range indicating that the battery is degraded so that the state of the battery is a dangerous state.

The diagnostic results of the control unit 120 according to which range the first peak change value and the second peak change value belong to among the plurality of reference ranges are shown in Table 1 below.

TABLE 1

| First target range | Second target range | | |
| | First reference range | Second reference range | Third reference range |
| --- | --- | --- | --- |
| First reference range | Battery not degraded | Positive electrode degraded (warning) | Positive electrode degraded (dangerous) |
| Second reference range | | Positive electrode degraded (warning) | Positive electrode degraded (dangerous) |
| | | Negative electrode degraded (warning) | Negative electrode degraded (warning) |
| Third reference range | | Positive electrode degraded (warning) | Positive electrode degraded (dangerous) |
| | | Negative electrode degraded (dangerous) | Negative electrode degraded (dangerous) |

As described above, the first target range refers to a range to which the first peak change value belongs among the plurality of reference ranges. Similarly, the second target range refers to a range to which the second peak change value belongs among the plurality of reference ranges. In addition, the content included between parentheses in Table 1 means the warning state or dangerous state described above.

Specifically, if the second target range is the first reference range, the control unit 120 may diagnose that the battery is not degraded.

In addition, if the first target range is the first reference range, the control unit 120 may diagnose that the cause of degradation of the battery is not negative electrode degradation. That is, the control unit 120 may diagnose that the battery is not degraded or that the positive electrode of the battery is degraded. Preferably, since the control unit 120 determines the first target range after determining the second target range first, if the first target range is the first reference range, the control unit 120 may diagnose that the cause of degradation of the battery is positive electrode degradation.

If the second target range is the second reference range, the control unit 120 may diagnose that the battery is degraded and the cause of degradation is positive electrode degradation. In addition, the control unit 120 may diagnose the degree of positive electrode degradation of the battery as a warning state.

In addition, if the second target range is the third reference range, the control unit 120 may diagnose that the battery is degraded and the cause of degradation is positive electrode degradation. In addition, the control unit 120 may diagnose the degree of positive electrode degradation of the battery as a dangerous state.

If the second target range is the second reference range or the third reference range and the first target range is the second reference range, the control unit 120 may diagnose that the battery is degraded and the cause of degradation is negative electrode degradation. In addition, the control unit 120 may diagnose the degree of negative electrode degradation of the battery as a warning state.

In addition, if the second target range is the second reference range or the third reference range and the first target range is the third reference range, the control unit 120 may diagnose that the battery is degraded and the cause of degradation is negative electrode degradation. In addition, the control unit 120 may diagnose the degree of negative electrode degradation of the battery as a dangerous state.

That is, referring to Table 1, the control unit 120 may diagnose whether the battery is degraded, the cause of degradation, and the degree of degradation according to the combination of the first target range and the second target range.

Therefore, the apparatus 100 for diagnosing a state of a battery according to an embodiment of the present disclosure may diagnose the state of the battery in detail in various aspects. In addition, since the state of the battery may be diagnosed even when the battery is high-rate charged, the state of the battery may be diagnosed more quickly.

In addition, as described above, the plurality of reference ranges may not be divided into only the three ranges as in Table 1 but be divided in more detail. In this case, the control unit 120 may diagnose the degree of degradation of the battery more specifically.

If it is diagnosed that the battery is degraded, the control unit 120 may be configured to adjust at least one of an upper limit of a SOC (State of charge) of the battery, a lower limit of the SOC, and an upper limit of a charging/discharging C-rate.

In order to delay the rate of degradation of the battery, the control unit 120 may be configured to adjust at least one of the upper limit of the SOC at which the battery may be charged to the maximum, the lower limit of the SOC at which the battery may be discharged to the maximum, the upper limit of the charging C-rate of the battery, and the lower limit of the discharging C-rate of the battery.

Specifically, the control unit 120 may lower the upper limit of the SOC of the battery. The control unit 120 may raise the lower limit of the SOC of the battery. The control unit 120 may lower the upper limit of the charging C-rate. The control unit 120 may lower the upper limit of the discharging C-rate.

That is, the apparatus 100 for diagnosing a state of a battery according to an embodiment of the present disclosure has an advantage of taking a measure for slowing the degradation rate of the battery according to the diagnosis result after diagnosing whether the battery is degraded.

The apparatus 100 for diagnosing a state of a battery according to an embodiment of the present disclosure may further include a storage unit 130.

Here, the storage unit 130 may store programs, data and the like required for the control unit 120 to diagnose a state of a battery. That is, the storage unit 130 may store data necessary for operation and function of each component of the apparatus 100 for diagnosing a state of a battery, data generated in the process of performing the operation or function, or the like. The storage unit 130 is not particularly limited in its kind as long as it is a known information storage means that can record, erase, update and read data. As an example, the information storage means may include random-access memory (RAM), flash memory, read-only memory (ROM), electrically erasable programmable read-only memory (EEPROM), registers, and the like. In addition, the storage unit 130 may store program codes in which processes executable by the control unit 120 are defined.

The storage unit 130 may be configured to store the voltage profile obtained by the profile obtaining unit 110 at every charging cycle in which the battery is charged.

Preferably, the storage unit 130 may store a voltage profile for each charging cycle to be distinguished. For example, the storage unit 130 may set an index for a charging cycle to a voltage profile stored therein.

The control unit 120 may be configured to obtain a plurality of differential profiles 300 from a plurality of voltage profiles stored in the storage unit 130. That is, the control unit 120 and the storage unit 130 may be communicatively connected. The control unit 120 may obtain at least one voltage profile stored in the storage unit 130 by accessing the storage unit 130. Preferably, the control unit 120 may obtain a plurality of voltage profiles stored in the storage unit 130.

In addition, the control unit 120 may selectively obtain a part of the plurality of voltage profiles stored in the storage unit 130. In this case, the control unit 120 may select a voltage profile to be obtained through an index set to the voltage profile.

FIG. 7 is a diagram schematically showing an example of a plurality of differential profiles 300, obtained by the apparatus 100 for diagnosing a state of a battery according to an embodiment of the present disclosure. FIG. 8 is a diagram schematically showing another example of the plurality of differential profiles 300, obtained by the apparatus 100 for diagnosing a state of a battery according to an embodiment of the present disclosure.

Preferably, the reference profile 200, the first differential profile 300a, the second differential profile 300b, the third differential profile 300c, the fourth differential profile 300d and the fifth differential profile 300e may be stored in the storage unit 130.

For example, in the embodiment of FIG. 7, the control unit 120 may selectively obtain the first differential profile 300a, the second differential profile 300b and the third differential profile 300c from the storage unit 130. As another example, in the embodiment of FIG. 8, the control unit 120 may selectively obtain the fourth differential profile 300d and the fifth differential profile 300e from the storage unit 130.

Hereinafter, for convenience of description, it is assumed that the number of charging/discharging cycles of the battery is increased in the order of the first differential profile 300a, the second differential profile 300b and the third differential profile 300c. For example, the first differential profile 300a is a differential profile 300 for a battery where the number of charging/discharging cycles is 100, the second differential profile 300b is a differential profile 300 for a battery where the number of charging/discharging cycles is 200, and the third differential profile 300c is a differential profile 300 for a battery where the number of charging/discharging cycles is 300. In addition, it is assumed that the number of charging/discharging cycles of the battery of the fourth differential profile 300d is smaller than the number of charging/discharging cycles of the battery of the fifth differential profile 300e.

In addition, the control unit 120 may be configured to determine a plurality of first peaks 310 and a plurality of second peaks 320 in the plurality of differential profiles 300.

In each of the plurality of differential profiles 300, the control unit 120 may determine a peak corresponding to the first reference peak R1 of the reference profile 200 as the first peak 310 and determine a peak corresponding to the second reference peak R2 as the second peak 320.

Referring to FIG. 7, the control unit 120 may determine first peaks 310a, 310b, 310c and second peaks 320a, 320b, 320c in the first differential profile 300a, the second differential profile 300b and the third differential profile 300c. Also, referring to FIG. 8, the control unit 120 may determine first peaks 310d, 310e and second peaks 320d, 320e in the fourth differential profile 300d and the fifth differential profile 300e, respectively.

That is, all of the first peak 310a of the first differential profile 300a, the first peak 310b of the second differential profile 300b, the first peak 310c of the third differential profile 300c, the first peak 310d of the fourth differential profile 300d, and the first peak 310e of the fifth differential profile 300e may be peaks corresponding to the first reference peak R1 of the reference profile 200.

Similarly, all of the second peak 320a of the first differential profile 300a, the second peak 320b of the second differential profile 300b, the second peak 320c of the third differential profile 300c, the second peak 320d of the fourth differential profile 300d, and the second peak 320e of the fifth differential profile 300e may be peaks corresponding to the second reference peak R2 of the reference profile 200.

The control unit 120 may be configured to diagnose whether the battery is degraded based on at least one of a behavior change of the plurality of determined first peaks 310 and a behavior change of the plurality of determined second peaks 320.

For example, in the embodiment of FIG. 7, the control unit 120 may calculate a difference of the differential capacities of the plurality of second peaks 320 based on the number of charging/discharging cycles of the battery. Specifically, the control unit 120 may calculate a peak change value based on the difference between the differential capacity value of the second peak 320a of the first differential profile 300a and the differential capacity value of the second peak 320b of the second differential profile 300b. In addition, the control unit 120 may calculate a peak change value based on the difference between the differential capacity value of the second peak 320b of the second differential profile 300b and the differential capacity value of the second peak 320c of the third differential profile 300c.

If the peak change value between the plurality of second peaks 320 increases as the number of charging/discharging cycles of the battery increases, the control unit 120 may diagnose that degradation of the battery is accelerated. Conversely, if the peak change value between the plurality of second peaks 320 decreases as the number of charging/discharging cycles of the battery increases, the control unit 120 may diagnose that degradation of the battery is decelerated.

For example, if the peak change value between the second peak 320b of the second differential profile 300b and the second peak 320c of the third differential profile 300c is greater than the peak change value between the second peak 320a of the first differential profile 300a and the second peak 320b of the second differential profile 300b, the control unit 120 may diagnose that the degradation of the battery is accelerated. In this case, at least one of the second peak change value between the second reference peak R2 of the reference profile 200 and the second peak 320a of the first differential profile 300a, the second peak change value between the second reference peak R2 and the second peak 320b of the second differential profile 300b, and the second peak change values between the second reference peak R2 and the second peak 320c of the third differential profile 300c may be greater than or equal to a predetermined magnitude. That is, if it is diagnosed that the battery is degraded based on at least one of the plurality of obtained differential profiles 300a, 300b, 300c, the control unit 120 may diagnose whether the battery is degraded.

In the above, with reference to the embodiment of FIG. 7, an embodiment in which the control unit 120 diagnoses whether the battery is degraded based on the first differential profile 300a, the second differential profile 300b and the third differential profile 300c has been described. However, unlike the embodiment of FIG. 7, the control unit 120 may diagnose whether the battery is degraded based on a larger number of differential profiles 300. In this case, the degradation of the battery may be diagnosed more accurately.

Hereinafter, an embodiment in which the control unit 120 diagnoses the cause of degradation of the battery based on at least one of the behavior change of the first peak 310 and the behavior change of the plurality of second peaks 320 will be described. However, for convenience of explanation, it should be noted that redundant description of the above-described content is excluded. Also, the behavior change of the plurality of first peaks 310 described below may be described based on the behavior change of the plurality of second peaks 320 described above.

The control unit 120 may be configured to diagnose the cause of degradation of the battery based on at least one of the behavior change of the plurality of determined first peaks 310 and the behavior change of the plurality of determined second peaks 320.

For example, it is assumed that the control unit 120 diagnoses that the degradation of the battery is accelerated based on the behavior change of the plurality of second peaks 320. That is, it is assumed that the peak change value between the plurality of second peaks 320 increases as the number of charging/discharging cycles of the battery increases, so that the control unit 120 diagnoses that degradation of the battery is accelerated. As in the embodiment of FIG. 7, if the peak change value between the plurality of first peaks 310 increases as the number of charging/discharging cycles of the battery increases, the control unit 120 may diagnose that the cause of accelerated degradation of the battery is positive electrode degradation and negative electrode degradation. Conversely, as in the embodiment of FIG. 8, if the peak change value between the plurality of first peaks 310 does not increase even if the number of charging/discharging cycles of the battery increases, the control unit 120 may diagnose that the cause of accelerated degradation of the battery is positive electrode degradation.

The apparatus 100 for diagnosing a state of a battery according to an embodiment of the present disclosure has an advantage of diagnosing not only whether the battery is degraded but also the cause of degradation of the battery, thereby diagnosing the state of the battery more specifically.

The apparatus 100 for diagnosing a state of a battery according to an embodiment of the present disclosure may be applied to a BMS (Battery Management System). That is, the BMS according to the present disclosure may include the apparatus 100 for diagnosing a state of a battery. In this configuration, at least some of the components of the apparatus 100 for diagnosing a state of a battery may be implemented by supplementing or adding functions of components included in a conventional BMS. For example, the profile obtaining unit 110, the control unit 120 and the storage unit 130 of the apparatus 100 for diagnosing a state of a battery may be implemented as components of the BMS.

In addition, the apparatus 100 for diagnosing a state of a battery according to an embodiment of the present disclosure may be provided to a battery pack. For example, the battery pack according to the present disclosure may include the apparatus 100 for diagnosing a state of a battery, and at least one battery cell. In addition, the battery pack may further include electrical equipment (a relay, a fuse, etc.), a case, and the like.

FIG. 9 is a diagram schematically showing a method for diagnosing a state of a battery according to another embodiment of the present disclosure. Each step of the method for diagnosing a state of a battery may be performed by the apparatus 100 for diagnosing a state of a battery.

Referring to FIG. 9, the method for diagnosing a state of a battery may include a voltage profile obtaining step (S100), a differential profile obtaining step (S200), a peak determining step (S300), a peak comparing step (S400), and a battery state diagnosing step (S500).

The voltage profile obtaining step (S100) is a step of obtaining a voltage profile of a battery for voltage and capacity of the battery, and may be performed by the profile obtaining unit 110. For example, while the battery is being charged at a C-rate of 0.33 C, the voltage profile may be obtained.

The differential profile obtaining step (S200) is a step of obtaining a differential profile 300 for the voltage and the capacity from the voltage profile obtained in the voltage profile obtaining step (S100), and may be performed by the control unit 120.

Here, the voltage profile is a profile for capacity Q and voltage V, and the differential profile 300 is a profile for voltage V and differential capacity (dQ/dV).

The peak determining step (S300) is a step of selecting a plurality of peaks included in a predetermined voltage section from the differential profile 300 obtained in the differential profile obtaining step (S200) and determining a first peak 310 associated with the negative electrode and a second peak 320 associated with the positive electrode among the plurality of selected peaks, and may be performed by the control unit 120.

The predetermined voltage section may be a voltage section preset such that the first reference peak R1 and the second reference peak R2 of the reference profile 200 belong thereto. For example, in the embodiments of FIGS. 5 and 6, the control unit 120 may determine the first reference peak R1 and the second reference peak R2 in the reference profile 200. Preferably, the first reference peak R1 is a peak having the largest differential capacity value in the reference profile 200, and the second reference peak R2 is a peak having the second largest differential capacity value in the reference profile 200. In addition, the control unit 120 may determine a peak corresponding to the first reference peak R1 as the first peak 310 in the differential profile 300 and determine a peak corresponding to the second reference peak R2 as the second peak 320.

The peak comparing step (S400) is a step of comparing the first peak 310 and the second peak 320 with the first reference peak R1 and the second reference peak R2 of the preset reference profile 200, respectively, and may be performed by the control unit 120.

Specifically, based on the change in the differential capacity value, the control unit 120 may determine a behavior change of the first peak 310 with respect to the first reference peak R1 and determine a behavior change of the second peak 320 with respect to the second reference peak R2.

The battery state diagnosing step (S500) is a step of diagnosing the state of the battery in consideration of at least one of the behavior change of the first peak 310 with respect to the first reference peak R1 and the behavior change of the second peak 320 with respect to the second reference peak R2, and may be performed by the control unit 120.

For example, the control unit 120 may diagnose whether the battery is degraded based on at least one of the behavior change of the first peak 310 and the behavior change of the second peak 320. In addition, the control unit 120 may specifically diagnose whether the positive electrode of the battery is degraded and/or the negative electrode of the battery is degraded.

The method for diagnosing a state of a battery according to an embodiment of the present disclosure may diagnose whether the battery is degraded in consideration of the behaviors of the first peak 310 and the second peak 320 included in the differential profile 300 of the battery. In particular, the method for diagnosing a state of a battery may more accurately diagnose the cause of degradation of the battery by specifically diagnosing whether the positive electrode of the battery is degraded or the negative electrode of the battery is degraded.

The embodiments of the present disclosure described above are not necessarily implemented by an apparatus and method but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: voltage profile
20: differential profile
100: apparatus for diagnosing a state of a battery
110: profile obtaining unit
120: control unit

130: storage unit
200: reference profile
300: differential profile
310: first peak
320: second peak
R1, R2: reference peak

What is claimed is:

1. An apparatus for diagnosing a state of a battery, the apparatus comprising:
   a controller; and
   memory having programmed thereon instructions that, when executed by the controller, cause the controller to:
   receive a voltage profile of the battery for a voltage and a capacity of the battery;
   obtain a differential profile for the voltage and a differential capacity from the voltage profile;
   select a plurality of peaks included in a predetermined voltage section from the differential profile, wherein the predetermined voltage section corresponds to a voltage range within which a first reference peak and a second reference peak of a preset reference profile appear;
   determine a first peak associated with a negative electrode and a second peak associated with a positive electrode from among the plurality of peaks;
   compare the first peak and the second peak with the first reference peak and the second reference peak of the preset reference profile, respectively; and
   diagnose the state of the battery based on at least one of a difference between the first peak and the first reference peak or a difference between the second peak and the second reference peak.

2. The apparatus according to claim 1, wherein the instructions are configured to cause the controller to set a largest peak in the preset reference profile as the first reference peak, and set a second largest peak in the preset reference profile as the second reference peak.

3. The apparatus according to claim 2, wherein each peak of the plurality of peaks in the differential profile, the first reference peak, and the second reference peak in the preset reference profile is a point at which a slope is 0, and at which an instantaneous change rate according to the voltage switches from positive to negative.

4. The apparatus according to claim 2, wherein the instructions are configured to cause the controller to set one of the plurality of peaks corresponding to the first reference peak in the differential profile as the first peak, and set another one of the plurality of peaks corresponding to the second reference peak in the differential profile as the second peak.

5. The apparatus according to claim 1, wherein the preset reference profile is a first profile for the voltage and the differential capacity of a reference cell corresponding to the battery, wherein the voltage and the differential capacity are measured while the reference cell is being charged within a predetermined C-rate range.

6. The apparatus according to claim 5, wherein the differential profile is a second profile for the voltage and the differential capacity of the battery, wherein the voltage and the differential capacity of the second profile are measured while the battery is being charged within the predetermined C-rate range.

7. The apparatus according to claim 1, wherein the instructions are configured to cause the controller to:

calculate a second peak change value by comparing the second peak with the second reference peak; and diagnose whether the battery is degraded based on the second peak change value.

8. The apparatus according to claim 7, wherein the instructions are configured to cause the controller to:

in response to the diagnosis indicating that the battery is degraded, calculate a first peak change value by comparing the first peak with the first reference peak; and diagnose a cause of the degradation of the battery based on the first peak change value and the second peak change value.

9. The apparatus according to claim 8, wherein the instructions are configured to cause the controller to, in response to the first peak change value and the second peak change value being equal to or greater than a predetermined magnitude, diagnose that the cause of the degradation of the battery is negative electrode degradation and positive electrode degradation.

10. The apparatus according to claim 8, wherein the instructions are configured to cause the controller to, in response to the first peak change value being smaller than a predetermined magnitude and the second peak change value being equal to or greater than the predetermined magnitude, diagnose that the cause of the degradation of the battery is positive electrode degradation.

11. The apparatus according to claim 7, wherein the instructions are configured to cause the controller to, in response to the diagnosis indicating that the battery is degraded, adjust at least one of an upper limit of a state of charge (SOC) of the battery, a lower limit of the SOC of the battery, or an upper limit of a charging/discharging C-rate of the battery.

12. The apparatus according to claim 1, wherein the instructions are configured to cause the controller to:

at each of a plurality of charging cycles in which the battery is charged, receive a respective voltage profile, wherein the memory is configured to store respective voltage profiles of the plurality of charging cycles;

for each respective voltage profile obtain a respective differential profile from the respective voltage profile;

for each respective differential profile, determine a respective first peak and a respective second peak in the respective differential profile; and diagnose whether the battery is degraded based on at least one of a difference between the respective first peak and the first reference peak, or a difference between the respective second peak and the second reference peak for at least one of the respective differential profiles of the plurality of charging cycles.

13. A battery pack comprising the apparatus according to claim 1.

14. A vehicle comprising the apparatus according to claim 1.

15. A method for diagnosing a state of a battery, the method comprising:

receiving, by a controller, a voltage profile of the battery for voltage and capacity of the battery;

obtaining, by the controller, a differential profile for the voltage and a differential capacity from the voltage profile;

selecting, by the controller, a plurality of peaks included in a predetermined voltage section from the differential profile, wherein the predetermined voltage section corresponds to a voltage range within which a first reference peak and a second reference peak of a preset reference profile appear;

determining, by the controller, a first peak associated with a negative electrode and a second peak associated with a positive electrode from among the plurality of peaks;

comparing, by the controller, the first peak and the second peak with the first reference peak and the second reference peak of the preset reference profile, respectively; and diagnosing, by the controller, the state of the battery based on at least one of a difference between the first peak and the first reference peak or a difference between the second peak and the second reference peak.

* * * * *